United States Patent
Jeong et al.

(10) Patent No.: US 7,508,332 B2
(45) Date of Patent: Mar. 24, 2009

(54) ON DIE THERMAL SENSOR HAVING ANALOG-TO-DIGITAL CONVERTER FOR USE IN SEMICONDUCTOR MEMORY DEVICE

(75) Inventors: Chun-Seok Jeong, Kyoungki-do (KR); Jae-Jin Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/819,795

(22) Filed: Jun. 29, 2007

(65) Prior Publication Data
US 2008/0106451 A1  May 8, 2008

(30) Foreign Application Priority Data
Nov. 2, 2006  (KR) .................. 10-2006-0107919

(51) Int. Cl.
*H03M 1/34* (2006.01)
(52) U.S. Cl. ...................... 341/164; 341/155
(58) Field of Classification Search ............... 341/155, 341/144, 164
See application file for complete search history.

(56) References Cited

U.S. PATENT DOCUMENTS

| | | | |
|---|---|---|---|
| 6,453,218 B1 | 9/2002 | Vergis | |
| 6,531,911 B1 | 3/2003 | Hsu et al. | |
| 6,876,250 B2 | 4/2005 | Hsu et al. | |
| 7,138,823 B2 | 11/2006 | Janzen et al. | |
| 2002/0021239 A1* | 2/2002 | Lance et al. | 341/155 |
| 2003/0164785 A1* | 9/2003 | Canini et al. | 341/155 |
| 2006/0111865 A1 | 5/2006 | Choi | |
| 2006/0158214 A1 | 7/2006 | Janzen et al. | |
| 2007/0040574 A1 | 2/2007 | Janzen et al. | |

FOREIGN PATENT DOCUMENTS

| | | |
|---|---|---|
| JP | 05-307882 | 11/1993 |
| JP | 07-296582 | 11/1995 |
| JP | 10-255467 | 9/1998 |
| KR | 10-2005-0082579 | 8/2005 |

OTHER PUBLICATIONS

Korean Notice of Allowance issued in Korean Patent Application No. 10-2006-0107919 dated on Jan. 30, 2008.

* cited by examiner

*Primary Examiner*—Jean B Jeanglaude
(74) *Attorney, Agent, or Firm*—McDermott Will & Emery LLP

(57) ABSTRACT

An On Die Thermal Sensor (ODTS) of a semiconductor memory device includes: a temperature detector for detecting an internal temperature of the semiconductor memory device to generate a temperature voltage corresponding to the detected internal temperature; a tracking ADC for outputting a digital code by comparing the temperature voltage with a tracking voltage and performing a counting operation to the result of comparison; and an operation controller for controlling operations of the temperature detector and the analog-to-digital converter, wherein the tracking ADC performs the counting operation using a first tracking scheme having a relatively large unit variation width of the digital code value during an initial tracking period and a second tracking scheme having a relatively small unit variation width of the digital code value after the initial tracking period.

26 Claims, 7 Drawing Sheets

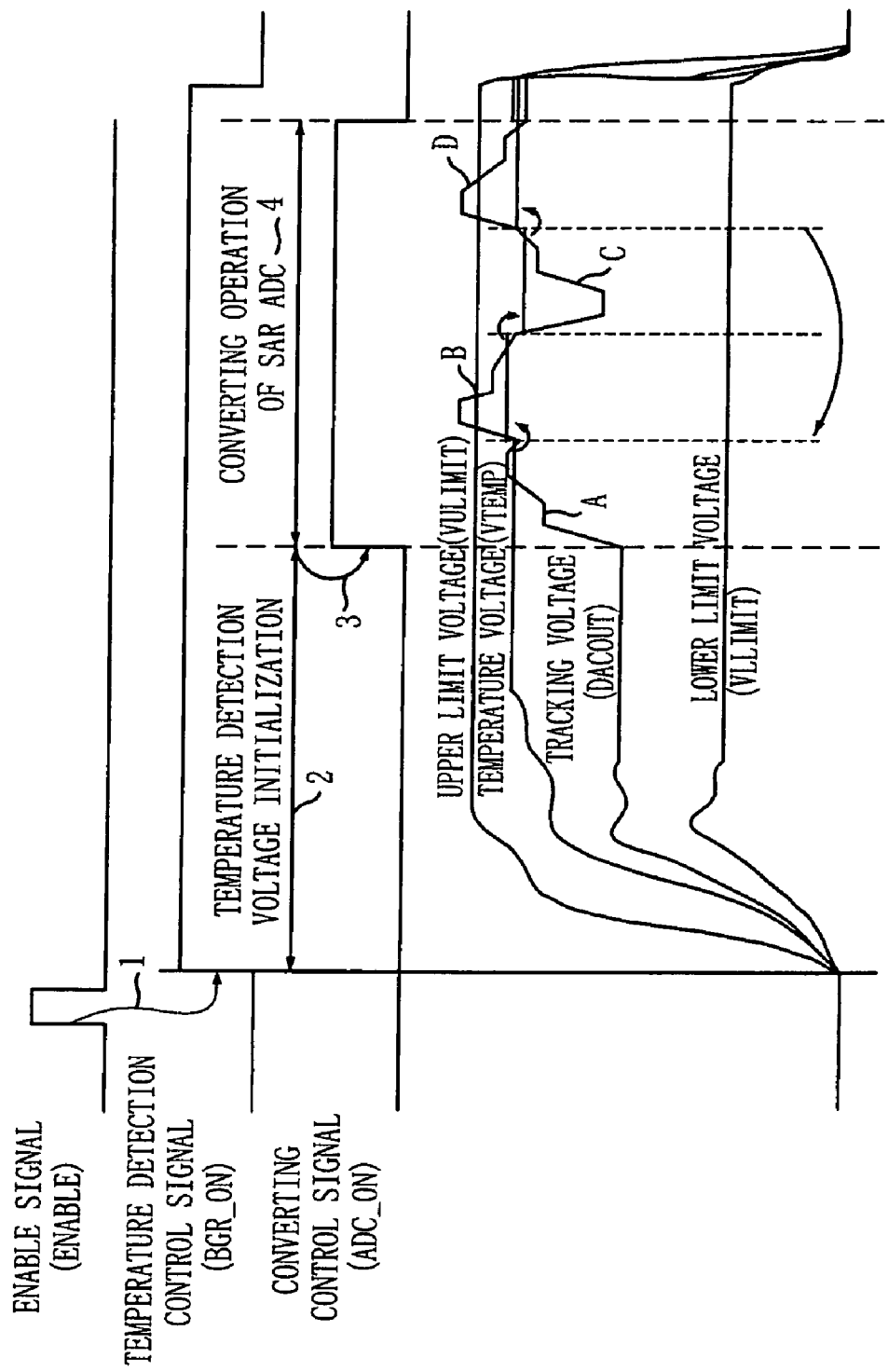

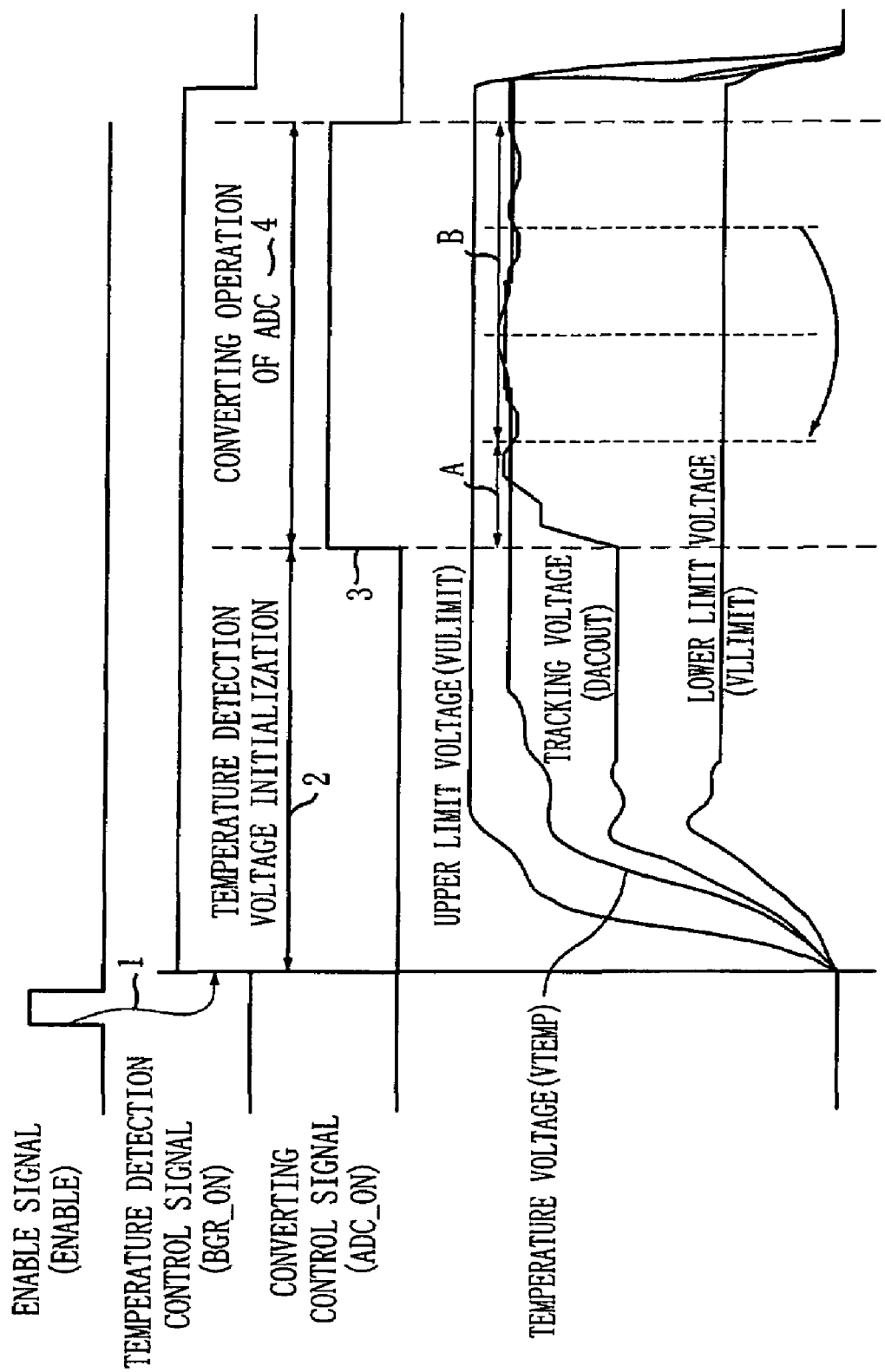

ON DIE THERMAL SENSOR HAVING ANALOG-TO-DIGITAL CONVERTER FOR USE IN SEMICONDUCTOR MEMORY DEVICE

CROSS-REFERENCE TO RELATED APPLICATIONS

The present invention claims priority of Korean patent application number 10-2006-0107919, filed on Nov. 2, 2006, which is incorporated by reference in its entirety.

BACKGROUND OF THE INVENTION

The present invention relates to an on die thermal sensor (ODTS) having an analog-to-digital converter (ADC) in a semiconductor memory device, and more particularly, to an ADC that performs a converting operation differently during and after an initial tracking period, and an ODTS for use in a semiconductor memory device having the same.

An analog-to-digital conversion is an electronic process of converting an analog signal into a digital signal without changing inherent contents of the analog signal.

An analog-to-digital converter (ADC) is an electronic circuit that converts a continuous analog signal into a discrete digital signal.

The reason for the analog-to-digital conversion is because the digital signals are clear and regular compared with the analog signals, and an electronic circuit which discriminates signals from disordered noise can be designed so easily that the signals can be transferred more efficiently.

Meanwhile, as the integration level and operating speed of a semiconductor memory device increases, a large amount of heat is generated from the semiconductor memory device. Since the generated heat increases internal temperature of the semiconductor memory device, the semiconductor memory device may be abnormally operated or damaged. Therefore, there is a need for a device for correctly detecting the temperature of the semiconductor memory device and outputting information about the detected temperature.

An ODTS is a device that measures the internal temperature of the semiconductor memory device and outputs information about the measured temperature in digital values.

Meanwhile, in order to prevent data loss, a dynamic random access memory (DRAM) reads data from a DRAM cell before the data is lost and recharges the DRAM cell according to the read data.

The operation of recharging the DRAM cell is referred to as a refresh operation. The data can be retained in the DRAM cell by repeating refresh operation periodically.

The refresh operation of the DRAM dissipates a refresh power. The reduction of power consumption is an important and critical issue to a low-power battery operated system.

One of many attempts to reduce power consumption in the refresh operation is to change a refresh period according to temperature. As the temperature becomes lower, the data retention time in the DRAM becomes longer. Therefore, the power consumption can be reduced by dividing a temperature range into a plurality of sub-ranges and relatively reducing a refresh clock frequency at a low temperature range. Therefore, there is a need for a device that can correctly detect the internal temperature of the DRAM and output information about the detected temperature.

However, the ODTS measures the internal temperature of the semiconductor device using the fact that the change in a base-emitter voltage (VBE) of a bipolar junction transistor (BJT) is about −1.8 mV/° C.

That is, the measurement of the internal temperature of the semiconductor memory device is to output temperature voltage having a predetermined voltage level according to the internal temperature of the semiconductor memory device. The temperature voltage means a voltage obtained by amplifying the base-emitter voltage (VBE) of the BJT to a predetermined level.

However, since other components of the semiconductor memory device, e.g., a refresh controller, requires digital temperature information, an ADC is necessary which can convert an analog value of the base-emitter voltage (VBE) of the BJT into a digital value.

Among various kinds of ADCs, a tracking ADC is most widely used in the semiconductor memory device. The tracking ADC tracks a level of an input voltage and determines a corresponding digital code.

FIG. 1 is a block diagram of a conventional tracking ADC 1.

Referring to FIG. 1, the conventional tracking ADC 1 includes a comparing unit 12 and a voltage level determining unit 13. The comparing unit 12 compares a level of a temperature voltage VTEMP with a level of a tracking voltage DACOUT and changes a value of a digital code DIGITAL_CODE according to the result of comparison. The voltage level determining unit 13 determines the level of the tracking voltage DACOUT in response to a test code TEST_CODE during a test mode operation, but the digital code DIGITAL_CODE is outputted from the comparing unit 12 during a normal mode operation.

In addition, the conventional tracking ADC 1 further includes a clock oscillating unit 14. The clock oscillating unit 14 controls an on/off operation of the comparing unit 12 by oscillating a clock signal CLK input to the comparing unit 12 in response to a converting control signal ADC_ON.

The comparing unit 12 includes a comparator 121 and an up/down counter 122. The comparator 121 compares the level of the temperature voltage VTEMP with the level of the tracking voltage DACOUT and determines logic levels of an increment signal INC and a decrement signal DEC according to the result of comparison. The up/down counter 122 changes the value of the digital code DIGITAL_CODE according to the increment signal INC and the decrement signal DEC.

The comparing unit 12 further includes a low pass filter (LPF) 123 for low-pass-filtering the increment signal INC and the decrement signal DEC.

When the level of the temperature voltage VTEMP is lower than that of the tracking voltage DACOUT, the comparator 121 activates the increment signal INC and deactivates the decrement signal DEC.

On the other hand, when the level of the temperature voltage VTEMP is higher than that of the tracking voltage DACOUT, the comparator 121 deactivates the increment signal INC and activates the decrement signal DEC.

The up/down counter 122 resets the digital code DIGITAL_ CODE to a set value in response to the converting control signal ADC_ON.

The LPF 123 transfers the increment signal INC and the decrement signal DEC to the up/down counter 122 when they have correct information. On the contrary, the LPF 123 does not transfer the increment signal INC and the decrement signal DEC to the up/down counter 122 when they do not have correct information due to the erroneous operation of the comparator 121.

Upon the filtering operation, the increment signal INC and the decrement signal DEC are not directly transferred to the up/down counter 122 even though the logic levels of the increment signal INC and the decrement signal DEC are determined at the first clock and are inputted to the LPF 123. Instead, whether to transfer the increment signal INC and the decrement signal DEC is determined after detecting the logic levels of the increment signal INC and the decrement signal DEC at the second and third clocks.

That is, when the comparator 121 operates normally, the logic levels of the successively-inputted increment signal INC and decrement signal DEC does not change abruptly. Therefore, whether the comparator 121 operates normally is determined by detecting the logic levels of the increment signal INC or the decrement signal DEC that is successively inputted three times.

The voltage level determining unit 13 includes a multiplexer 131 and a digital-to-analog converter (DAC) 132. The multiplexer 131 selects one of the digital code DIGITAL_CODE and the test code TEST_CODE in response to a test mode operation signal TEST_MODE. The DAC 132 determines the level of the tracking voltage DACOUT in response to the digital code DIGITAL_CODE or the test code TEST_CODE outputted from the multiplexer 131.

In addition, the voltage level determining unit 13 includes a decoder 133 for decoding the output signal of the multiplexer 131 to output a decoding signal group SW<0:N>, N being a positive integer, so that occurrence of undesired glitch in the DAC 132 can be prevented.

An upper limit voltage VULIMIT input to the DAC 132 is a voltage at which the level of the tracking voltage DACOUT can be determined to be maximum. A lower limit voltage VLLIMIT input to the DAC 132 is a voltage at which the level of the tracking voltage DACOUT can be determined to be minimum. The upper limit voltage VULIMIT and the lower limit voltage VLLIMIT are defined by the user.

At this point, the multiplexer 131 selects one of the digital code DIGITAL_CODE and the test code TEST_CODE in order to test the operation of the tracking ADC 1 according to the user's selection.

Since the multiplexer 131 and the decoder 133 are provided for supplementary operation of the tracking ADC 1, the basic operation of the tracking ADC 1 can be performed without them.

When the tracking ADC 1 operates in response to the activated counter control signal ADC_ON, the clock oscillating unit 14 controls the operations of the comparator 121, the LPF 123, and the up/down counter 122 by oscillating the clock signal CLK in response to the converting control signal ADC_ON.

The reason why the clock oscillating unit 14 and the clock signal CLK are necessary for the tracking ADC 1 is as follows.

An object of the tracking ADC 1 is to find the digital code DIGITAL_CODE corresponding to the temperature voltage VTEMP. Assuming that the level of the inputted temperature voltage VTEMP is fixed, the level of the tracking voltage DACOUT is changed until the level of the temperature voltage VTEMP becomes equal to that of the tracking voltage DACOUT.

The level of the tracking voltage DACOUT can be changed by varying the value of the digital code DIGITAL_CODE. Since the tracking voltage DACOUT having the level equal to that of the temperature voltage VTEMP cannot be found by varying the unit of the digital code DIGITAL_CODE only one time, the operation of varying the value of the digital code DIGITAL_CODE must be performed several times.

That is, in order to repeat the operation of varying the value of the digital code DIGITAL_CODE several times, the comparator 121, the LPF 123, and the up/down counter 122 are turned on/off several times using the clock signal CLK that continuously toggles while the converting control signal ADC_ON is in the active state.

A plurality of delay circuits DLY1, DLY2 and DLY3 are provided among the comparator 121, the LPF 123, and the up/down counter 122 in order to define their operation order in transferring the clock signal CLK.

That is, if the LPF 123 and the up/down counter 122 operate while the comparator 121 does not finish its operation, the tracking ADC 1 cannot operate normally. Therefore, the plurality of delay circuits DLY1, DLY2 and DLY3 are provided for transferring the clock signal CLK at constant time intervals according to the operation order of the respective units.

In addition, delay time of the plurality of delay circuits DLY1, DLY2 and DLY3 may be different and is previously determined by the user or designer.

Whenever the clock signal CLK is toggled, the operation of varying the value of the digital code DIGITAL_CODE is performed one time. Thus, the final output of the clock signal CLK can be used as an update signal indicating that the digital code value is changed.

The tracking ADC can be classified into a sequential access ADC and a successive approximation register (SAR) ADC, depending on the converting methods.

The sequential access ADC finds the digital code corresponding to the inputted analog value by increasing or decreasing the digital code, which is outputted when the clock signal CLK is toggled one time, from the least significant bit (LSB) by 1.

The SAR ADC finds the digital code corresponding to the inputted analog value by increasing or decreasing the digital code DIGITAL_CODE, which is outputted when the clock signal CLK is toggled one time, from the most significant bit (MSB) by 1.

FIG. 2A is a flowchart showing a converting operation of the SAR ADC.

Referring to FIG. 2A, the desired digital code value is found by increasing or decreasing the digital code DIGITAL_CODE from the MSB by 1.

FIG. 2B is a timing diagram of signals used in an ODTS using the sequential access ADC.

Referring to FIG. 2B, the operation of the ODTS using the sequential access ADC is as follows.

First, a temperature detection control signal BGR_ON is activated in response to the toggling of an enable signal ENABLE, as indicated by a reference number "1".

Second, the ODTS detects the temperature in response to the activated temperature detection control signal BGR_ON. Then, the levels of the upper limit voltage VULIMIT and the lower limit voltage VLLIMIT containing the temperature voltage VTEMP are initialized, as indicated by a reference numeral "2". The temperature voltage means a voltage output according to the detected temperature. At this point, the time during which the temperature detection control signal BGR_ON is activated and maintained is set by the user.

Third, a converting control signal ADC_ON is activated at the same time when an initialization of the temperature detection voltage is finished, as indicated by a reference numeral "3".

Fourth, the ODTS performs the counting operation of the sequential access ADC in response to the activated converting control signal ADC_ON, as indicated by a reference numeral "4".

At this point, a time during which the converting control signal ADC_ON is activated and maintained is set by the user.

In the converting operation of the sequential access ADC in the ODTS, the tracking voltage DACOUT has a small unit variation width in order to have the same value (a value within an error range) as the level of the temperature voltage VTEMP.

That is, in the converting operation of the sequential access ADC, the ODTS operates while maintaining the level of the tracking voltage DACOUT with a small unit variation width for a relatively long time and then finds a value equal to the level of the temperature voltage VTEMP, i.e., a value within an error range.

The sequential access ADC is implemented with a simple circuit, but has the following problems.

First, because the digital code value is increased or decreased from the LSB by 1 when the clock signal CLK is toggled one time, it takes a relatively long time to find the digital code DIGITAL_CODE corresponding to the level of the temperature voltage VTEMP.

Second, when a plurality of temperature voltages are inputted with different voltage levels, time taken to find the digital code value corresponding to the voltage level varies depending on the respective temperature voltage That is, time taken to convert the digital code DIGITAL_CODE varies depending on the level of the plurality of temperature voltages.

When a plurality of signals have different levels of the inputted temperature voltages, the time to find the digital code values corresponding to the levels of the temperature voltage VTEMP changes depending on the levels of the temperature voltage VTEMP.

FIG. 2C is a timing diagram of signals used in the ODTS using the SAR ADC.

Referring to FIG. 2C, the operation of the ODTS using the SAR ADC is as follows.

First, a temperature detection control signal BGR_ON is activated in response to the toggling of an enable signal ENABLE, as indicated by a reference number "1".

Second, the ODTS detects the temperature in response to the activated temperature detection control signal BGR_ON. Then, the levels of the upper limit voltage VULIMIT and the lower limit voltage VLLIMIT containing the temperature voltage VTEMP are initialized, as indicated by a reference numeral "2". The temperature voltage is a voltage output according to the detected temperature.

At this point, the time during which the temperature detection control signal BGR_ON is activated and maintained is set by the user.

Third, a converting control signal ADC_ON is activated at the same time when the initialization of temperature detection voltage is finished, as indicated by a reference numeral "3".

Fourth, the ODTS performs the counting operation of the SAR ADC in response to the activated converting control signal ADC_ON, as indicated by a reference numeral "4".

At this point, the time during which the converting control signal ADC_ON is activated and maintained is set by the user.

In the converting operation of the SAR ADC in the ODTS, the tracking voltage DACOUT has a large unit variation width in order to have the same value (a value within an error range) as the level of the temperature voltage VTEMP.

That is, in the converting operation of the SAR ADC, the ODTS operates while maintaining the level of the tracking voltage DACOUT with a large unit variation width for a relatively short time and then finds a value equal to the level of the temperature voltage VTEMP, i.e., a value within an error range.

Like the sequential access ADC, the SAR ADC is implemented with a simple circuit and it takes a short time to find the digital code corresponding to the level of the temperature voltage VTEMP. However, the SAR ADC has the following drawbacks that do not occur in the sequential access ADC.

First, when the level of the inputted temperature voltage VTEMP changes during the converting operation, the accuracy of the found digital code DIGITAL_CODE is not reliable.

That is, an operation of locking the inputted temperature voltage VTEMP using sample/hold is necessary during a full-tracking operation of determining all bit values in order from the MSB to the LSB.

Second, even after the digital code corresponding to the level of the temperature voltage VTEMP is found through the full-tracking operation during the initial converting operation, as indicated by a reference symbol "A", the full-tracking operation must be again performed so as to find a correct digital code DIGITAL_CODE if the level of the temperature voltage VTEMP is changed, as indicated by reference symbols "B", "C" and "D".

That is, the full-tracking operation of increasing or decreasing the digital code from the MSB to the LSB by 1 must be performed even though the level of the temperature voltage VTEMP is slightly changed during the converting operation after the initial converting operation.

SUMMARY OF THE INVENTION

Embodiments of the present invention are directed to providing an on die thermal sensor (ODTS) having an analog-to-digital converter (ADC) for performing a converting operation at a high speed by using the different tracking methods during and after the initial tracking period. Accordingly, a correct value of a digital signal can be outputted even though the value of an inputted analog signal is changed during the converting operation.

In accordance with the first aspect of the present invention, there is provided an ODTS of a semiconductor memory device, including: a temperature detector for detecting an internal temperature of the semiconductor memory device to generate a temperature voltage corresponding to the detected internal temperature; a tracking analog-to-digital converter (ADC) for outputting a digital code by comparing the temperature voltage with a tracking voltage and performing a counting operation according to the result of comparison; and an operation controller for controlling operations of the temperature detector and the analog-to-digital converter, wherein the tracking ADC performs the counting operation using a first tracking scheme having a relatively large unit variation width of the digital code value during an initial tracking period and a second tracking scheme having a relatively small unit variation width of the digital code value after the initial tracking period.

In accordance with the second aspect of the present invention, there is provided an ADC for converting an analog input voltage into a digital code value corresponding to a level of the analog input voltage, comprising: a comparing unit for comparing the analog input voltage with a tracking voltage; a counting unit for performing a counting operation according to the result of comparison to output the digital code in response to a counting control signal; and an internal digital-to-analog converting unit for generating the tracking voltage corresponding to the digital code value, wherein the counting unit performs the counting operation using a first tracking scheme having a relatively large unit variation width of the digital code value during an initial tracking period and a second tracking scheme having a relatively small unit variation width of the digital code value after the initial tracking period.

In accordance with the third aspect of the present invention, there is provided an analog-to-digital method for converting an analog input voltage into a digital code value corresponding to a level of the analog input voltage, comprising: comparing an analog input voltage with a tracking voltage; counting a digital code value corresponding to the result of comparison in response to a counting control signal, the digital code value being counted with a relatively large unit variation width during an initial tracking period, the digital code value being counted with a relatively small unit variation width after the initial tracking period; and generating the tracking voltage corresponding to the digital code value.

In accordance with the fourth aspect of the present invention, there is provided an ODTS of a semiconductor memory device, comprising: a temperature detector for detecting an internal temperature of a semiconductor device to generate a temperature voltage corresponding to the detected temperature; a multi-tracking type analog-to-digital converter for receiving the temperature voltage to output a digital code value corresponding to a level of the temperature voltage through a multi-tracking scheme; and an operation controller for controlling operations of the temperature detector and the multi-tracking type analog-to-digital converter.

In accordance with the fifth aspect of the present invention, there is provided an ADC for converting an analog input voltage into a digital code value corresponding to a level of the analog input voltage, comprising: a comparing unit for comparing the analog input voltage with a tracking voltage; a multi-tracking type counting unit for outputting the digital code value by performing a counting operation according to the result of comparison through a multi-tracking scheme in response to a counting control signal; and an internal digital-to-analog converting unit for generating the tracking voltage corresponding to the digital code value.

BRIEF DESCRIPTION OF THE DRAWINGS

FIG. 2C is a timing diagram of signals used in an ODTS using a conventional SAR ADC;

FIG. 5 is a timing diagram of signals used in an ODTS using a tracking ADC in accordance with an embodiment of the present invention.

DESCRIPTION OF SPECIFIC EMBODIMENTS

Hereinafter, an on die thermal sensor (ODTS) having an analog-to-digital converter (ADC) in a semiconductor memory device in accordance with exemplary embodiments of the present invention will be described in detail with reference to the accompanying drawings.

Figure 1:
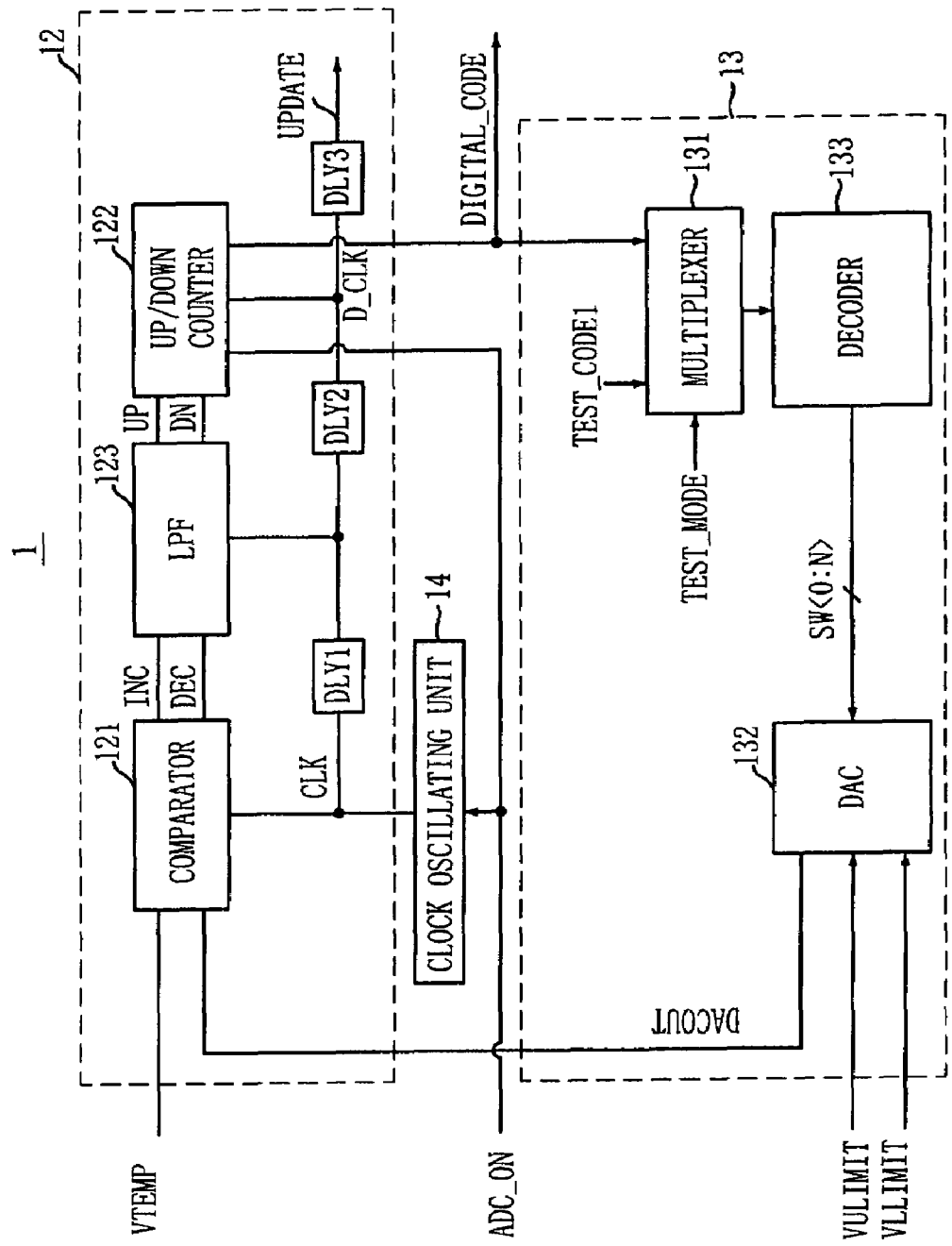
FIG. 1 is a block diagram of a conventional tracking analog-to-digital converter (ADC)
Figure 2A:
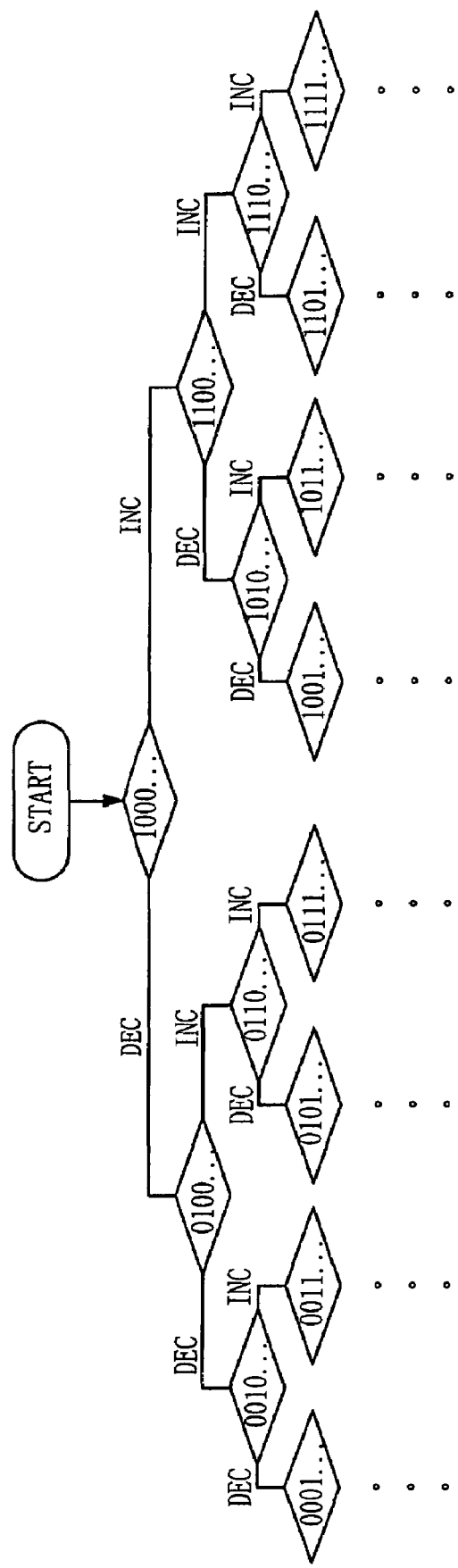
FIG. 2A is a flowchart showing a converting operation of a conventional SAR ADC.
Figure 2B:
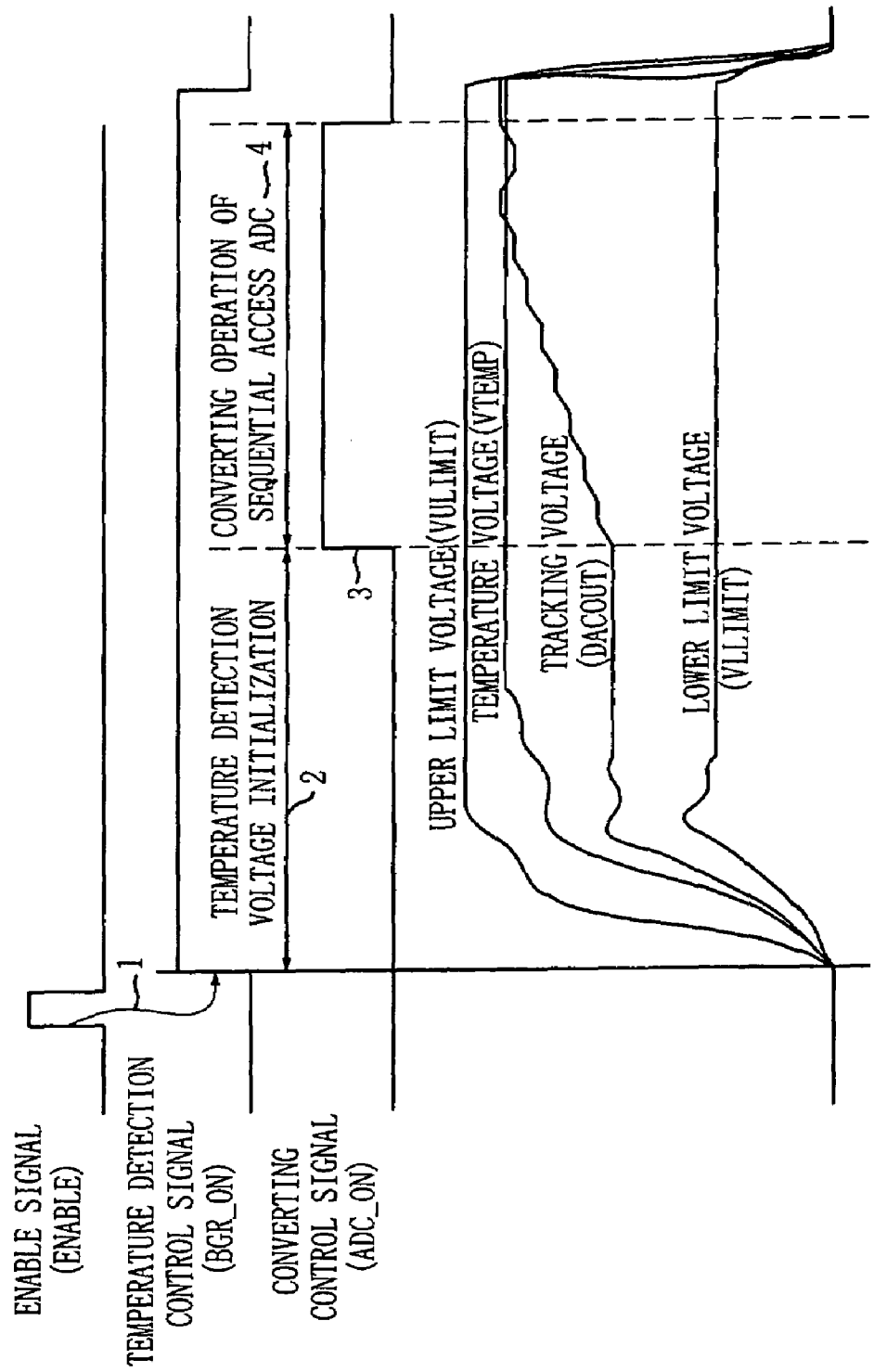
FIG. 2B is a timing diagram of signals used in an ODTS using a conventional sequential access ADC.
Figure 3:
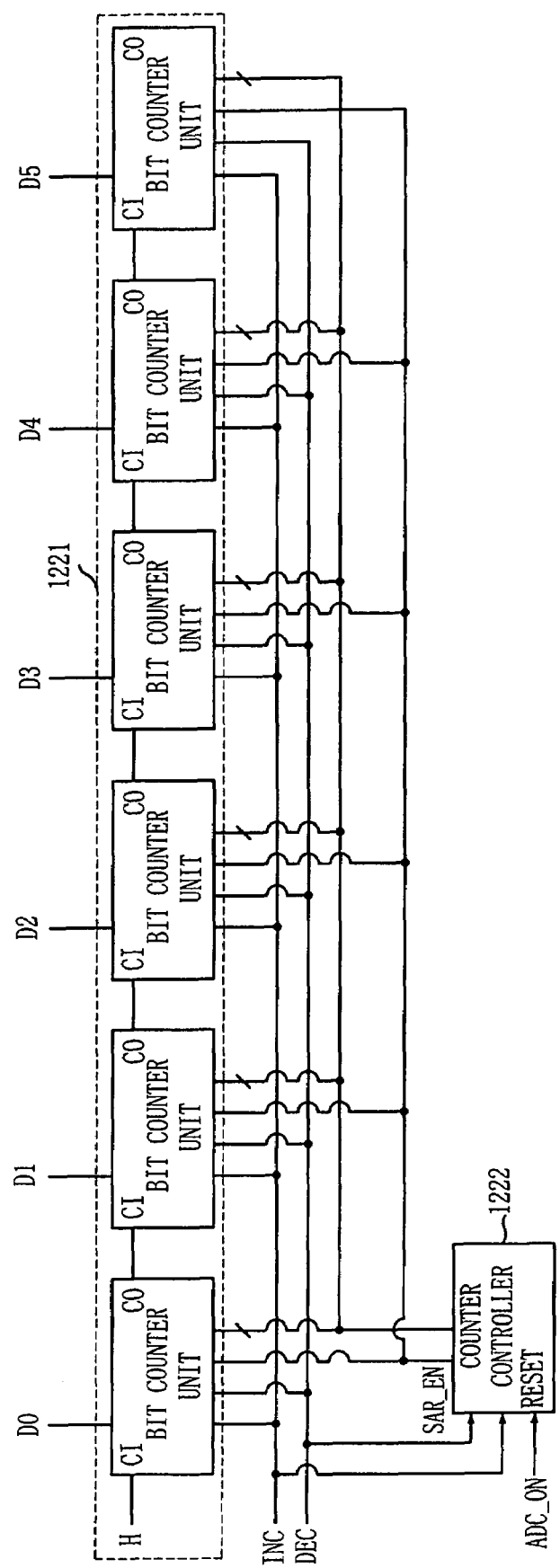
FIG. 3 is a block diagram of an up/down counter of a tracking ADC in accordance with an embodiment of the present invention.

FIG. 3 is a block diagram of an up/down counter of a tracking ADC in accordance with an embodiment of the present invention.

An operation of an up/down counter of the tracking ADC will be described below with reference to FIG. 3.

The tracking ADC is enabled/disabled in response to a converting control signal ADC_ON and determines a digital code value corresponding to a level of an temperature voltage VTEMP by using a first tracking scheme of counting the digital code value with a relatively large unit variation width during an initial tracking period and a second tracking scheme of counting the digital code value with a relatively small unit variation width after the initial tracking period.

The first tracking scheme is a successive approximation register (SAR) scheme. When the clock signal CLK is toggled one time, unit variation width of the digital code is relatively large because the outputted digital code value is changed from the MSB by 1.

That is, when the tracking ADC begins to operate in response to the converting control signal ADC_ON of a logic high level, the SAR scheme is used to perform the full-tracking operation of determining the bit values in order from the MSB to the LSB. In this way, the digital code value corresponding to the level of the inputted temperature voltage VTEMP can be found relatively fast.

The second tracking scheme is the sequential access scheme. When the clock signal CLK is toggled one time, the unit variation width of the digital code is relatively small because the outputted digital code value is changed from the LSB by 1.

That is, the digital code value corresponding to the level of the temperature voltage VTEMP is found during the initial tracking period. Therefore, even though the level of the temperature voltage VTEMP input is later changed, the digital code value corresponding to the level of the changed temperature voltage VTEMP can be found without performing the full-tracking operation because of the use of the sequential access scheme.

The up/down counter of the tracking ADC in accordance with an embodiment of the present invention includes a plurality of bit counters 1221 and a counter controller 1222. The bit counters 1221 store the digital code 1-bit by 1-bit, i.e., D0, D1, D2, D3, D4 and D5, and changes the digital code value in response to an increment signal INC and a decrement signal DEC. The counter controller 1222 controls the operation of the bit counters 1221.

The counter controller 1222 decides whether to operate the bit counters 1221 in the first scheme (SAR scheme) or the second scheme (sequential access scheme) by determining a level of an operation select signal SAR_EN in response to the increment signal INC and the decrement signal DEC.

When the tracking ADC operates in the initial tracking period in response to the activated converting control signal ADC_ON, the counter controller 1222 determines the level of the operation select signal SAR_EN to be a logic low level to thereby operate the bit counters 1221 in the first tracking scheme (SAR scheme).

When the initial tracking period of the tracking ADC ends after a predetermined time elapses, the counter controller 1222 determines the level of the operation select signal SAR_EN to be a logic high level to thereby operate the bit counters 1221 in the second tracking scheme (sequential access scheme).

The predetermined time is the time when the full-tracking operation for determining the bit values in order from the MSB to the LSB ends. However, the predetermined time can be set by the user.

The counter controller 1222 initializes each digital code (D0, D1, D2, D3, D4 and D5) stored in the bit counters 1221 to a set value in response to the converting control signal ADC_ON input to a reset terminal RESET.

Each of the digital code (D0, D1, D2, D3, D4 and D5) stored in the bit counters 1221 is initialized to the set value at a rising edge of the converting control signal ADC_ON, that is, at a low-to-high transition of the converting control signal ADC_ON.

At this point, the set value of the initialized digital code value can be changed by the user. That is, the set value of the initialized digital code value can be changed depending on purpose of the tracking ADC and a method of defining the digital code.

Figure 4:
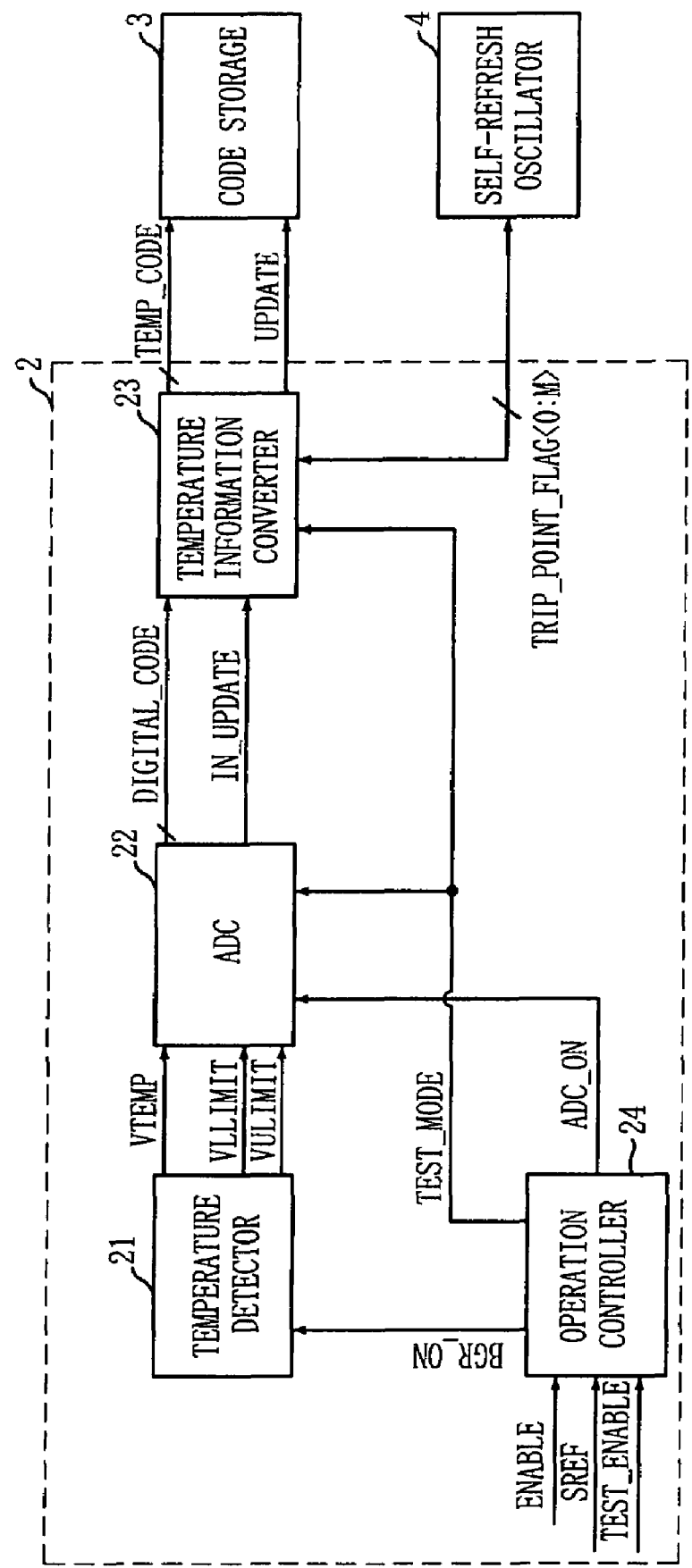
FIG. 4 is a block diagram of an ODTS with a tracking ADC and a peripheral device in accordance with an embodiment of the present invention.

FIG. 4 is a block diagram of the ODTS with the tracking ADC and a peripheral device in accordance with an embodiment of the present invention.

Referring to FIG. 4, the ODTS 2 includes a temperature detector 21, an ADC 22, a temperature information converter 23, and an operation controller 24.

The temperature detector 21 detects an internal temperature of a semiconductor device and changes a level of a temperature voltage VTEMP according to the detected temperature.

The ADC 22 is enabled and disabled in response to the converting control signal ADC_ON and determines a value of a digital code DIGITAL_CODE corresponding to a level of the temperature voltage VTEMP by using a first tracking scheme of counting the value of the digital code DIGITAL_CODE with a relatively large unit variation width during an initial tracking period and a second tracking scheme of counting the value of the digital code DIGITAL_CODE with a relatively small unit variation width after the initial tracking period.

When the value of the digital code DIGITAL_CODE is changed, the ADC reports the change of the digital code DIGITAL_CODE by toggling an internal update signal IN_UPDATE.

The first tracking scheme is the SAR scheme. When the clock signal CLK is toggled one time, unit variation width of the digital code DIGITAL_CODE is relatively large because the outputted digital code value is changed from the MSB by 1.

That is, when the ADC 22 begins to operate in response to the converting control signal ADC_ON of a logic high level, the SAR scheme is used to perform the full-tracking operation of determining the bit values in order from the MSB to the LSB. In this way, the digital code value corresponding to the level of the inputted temperature voltage VTEMP can be found relatively fast.

The second tracking scheme is the sequential access scheme. When the clock signal CLK is toggled one time, the unit variation width of the digital code DIGITAL_CODE is relatively small because the outputted digital code value is changed from the LSB by 1.

That is, the value of the digital code DIGITAL_CODE corresponding to the level of the temperature voltage VTEMP is found during the initial tracking period. Therefore, even though the level of the temperature voltage VTEMP input is later changed, the digital code value corresponding to the level of the changed temperature voltage VTEMP can be found without performing the full-tracking operation because of the use of the second tracking scheme, i.e., sequential access scheme.

The temperature information converter 23 receives the digital code DIGITAL_CODE and performs a predetermined operation so that it can eliminate an error that may occur in the temperature detector 21 and the ADC 22. In addition, the temperature information converter 23 converts the digital code DIGITAL_CODE into a temperature code TEMP_CODE and a trip point flag signal group TRIP_POINT_FLAG<0:M>, M being a positive integer.

The temperature code is outputted in response to the internal update signal IN_UPDATE. At this point, an update signal UPDATE indicating the change of the temperature code is also outputted to the outside of the ODTS.

The operation controller 24 controls a normal mode operation of the ODTS 2 in response to an enable signal ENABLE received from a memory register set (MRS). In addition, the operation controller 24 controls a self-refresh mode operation of the ODTS 2 in response to a self-refresh signal SREF.

The temperature detector 21 is enabled when the temperature detection control signal BGR_ON is activated, and the ADC 22 is enabled when the converting control signal ADC_ON is activated.

The operation controller 24 controls a test mode operation of the ODTS 2 in response to a test enable signal TEST_ENABLE by controlling a logic level of a test mode signal TEST_MODE.

A code storage 3 disposed outside the ODTS 2 stores the temperature code TEMP_CODE outputted from the temperature information converter 23 of the ODTS 2 in response to the update signal UPDATE. The stored temperature code TEMP_CODE is read by a memory controller and is used to change the refresh period.

A self-refresh oscillator 4 disposed outside the ODTS 2 operates in the self-refresh mode and controls the change of the self-refresh period in response to the trip point flag signal group TRIP_POINT_FLAG<0:M> outputted from the temperature information converter 23 of the ODTS 2.

FIG. 5 is a timing diagram of signals used in the ODTS using the tracking ADC in accordance with an embodiment of the present invention.

An operation of the ODTS using the tracking ADC in accordance with the embodiment of the present invention will be described below with reference to FIG. 5.

First, a temperature detection control signal BGR_ON is activated in response to a toggling of an enable signal ENABLE, as indicated by a reference numeral "1".

Second, the ODTS detects the temperature in response to the activated temperature detection control signal BGR_ON. Then, the levels of the upper limit voltage VULIMIT and the lower limit voltage VLLIMIT containing the temperature voltage VTEMP are initialized, as indicated by a reference numeral "2". The temperature voltage is a voltage output varying according to the detected temperature.

At this point, the time during which the temperature detection control signal BGR_ON is activated and maintained is set by the user.

Third, a converting control signal ADC_ON is activated at the same time when an initialization of the temperature detection voltage initialization is finished, as indicated by a reference numeral "3".

Fourth, the ODTS performs the counting operation of the sequential access ADC in response to the activated converter converting signal ADC_ON, as indicated by a reference numeral "4".

At this point, the time during which the converting control signal ADC_ON is activated and maintained is set by the user.

In the converting operation of the ADC in the ODTS, the tracking voltage DACOUT is changed with a relatively large variation width during the initial tracking period, indicated by a reference symbol "A". Therefore, even though the level of the tracking voltage DACOUT has a relatively large difference with the temperature voltage VTEMP, the level of the tracking voltage DACOUT can track the level of the temperature voltage VTEMP in a relatively short time.

In addition, the tracking voltage DACOUT is changed with a relatively small variation width after the initial tracking period, indicated by a reference symbol "B". Even though the level of the temperature voltage VTEMP is changed, the level of the tracking voltage DACOUT can track the level of the temperature voltage VTEMP in a relatively short time.

That is, the operation of changing the level of the tracking voltage DACOUT during the initial tracking period is different from the operation of changing the level of the tracking voltage DACOUT after the initial tracking period, so that the tracking voltage DACOUT and the temperature voltage VTEMP can have the equal level, i.e., a value within an error range.

As described above, the ADC can perform the converting operation at a high speed by using the different tracking methods during and after the initial tracking period. Accordingly, the correct value of the digital signal can be outputted even though the value of the inputted analog signal changes during the converting operation.

In addition, the ODTS using the above-described ADC can output the temperature information more rapidly. Hence, it is possible to flexibly cope with the changes of the specification on the operation of the ODTS, for example, the change of the activation time of the converting control signal ADC_ON.

While the present invention has been described with respect to the specific embodiments, it will be apparent to those skilled in the art that various changes and modifications may be made without departing from the spirit and scope of the invention as defined in the following claims.

What is claimed is:

1. An on die thermal sensor (ODTS) of a semiconductor memory device, comprising:
   a temperature detector for detecting an internal temperature of the semiconductor memory device to generate a temperature voltage corresponding to the detected internal temperature;
   a tracking analog-to-digital converter (ADC) for outputting a digital code by comparing the temperature voltage with a tracking voltage and performing a counting operation according to the result of comparison; and
   an operation controller for controlling operations of the temperature detector and the analog-to-digital converter,
   wherein the tracking ADC performs the counting operation using a first tracking scheme having a relatively large unit variation width of the digital code value during an initial tracking period and a second tracking scheme having a relatively small unit variation width of the digital code value after the initial tracking period.

2. The ODTS as recited in claim 1, wherein the first tracking scheme includes a successive approximation register (SAR) scheme.

3. The ODTS as recited in claim 1, wherein the second tracking scheme includes a sequential access scheme.

4. The ODTS as recited in claim 1, wherein the tracking ADC includes:
   a comparing unit for comparing a level of the temperature voltage with a level of the tracking voltage and changing the digital code value according to the comparison result; and
   a level determining unit for determining the level of the tracking voltage in response to a test code during a test mode operation and in response to the digital code output from the comparing unit during a normal mode operation.

5. The ODTS as recited in claim 4, wherein the tracking ADC further includes a clock oscillating unit for controlling on/off operations of the comparing unit by oscillating a clock signal input as a clock input of the comparing unit in response to a converting control signal output from the operation controller.

6. The ODTS as recited in claim 4, wherein the comparing unit includes:
   a comparator for comparing the level of the temperature voltage with the level of the tracking voltage and determining logic levels of an increment signal and a decrement signal according to the result of comparison; and
   an up/down counter for changing the digital code value in response to the increment signal and the decrement signal.

7. The ODTS as recited in claim 6, wherein the comparing unit further includes a low pass filter for low-pass-filtering the increment signal and the decrement signal.

8. The ODTS as recited in claim 6, wherein the up/down counter resets the digital code to a set value in response to a converting control signal output from the operation controller.

9. The ODTS as recited in claim 6, wherein the up/down counter includes:
   a plurality of bit counters for separately storing the temperature code bit by bit and changing the stored digital code value in response to the increment signal and the decrement signal; and
   a counter controller for controlling the operations of the plurality of bit counters.

10. The ODTS as recited in claim 9, wherein the counter controller controls the bit counters to operate in one of the first tracking scheme and the second tracking scheme by determining a logic level of an operation select signal in response to the increment signal and the decrement signal.

11. The ODTS as recited in claim 9, wherein the counter controller resets the temperature code stored in the plurality of bit counters to the set value in response to the converting control signal.

12. The ODTS as recited in claim 4, wherein the level determining unit includes:
   a multiplexer for selecting one of the digital code and the test code in response to a test mode operation signal; and
   a digital-to-analog converter for determining the level of the tracking voltage in response to the digital code or the test code output from the multiplexer.

13. The ODTS as recited in claim 12, further comprising a decoder for decoding the digital code or the test code output from the multiplexer so as to prevent the occurrence of glitch.

14. An analog-to-digital converter for converting an analog input voltage into a digital code value corresponding to a level of the analog input voltage, comprising:
   a comparing unit for comparing the analog input voltage with a tracking voltage;
   a counting unit for performing a counting operation according to the comparison result to output the digital code in response to a counting control signal; and
   an internal digital-to-analog converting unit for generating the tracking voltage corresponding to the digital code value,
   wherein the counting unit performs the counting operation using a first tracking scheme having a relatively large unit variation width of the digital code value during an initial tracking period and a second tracking scheme having a relatively small unit variation width of the digital code value after the initial tracking period.

15. The analog-to-digital converter as recited in claim 14, wherein the first tracking scheme includes a successive approximation register (SAR) scheme.

16. The analog-to-digital converter as recited in claim 14, wherein the second tracking scheme includes a sequential access scheme.

17. The analog-to-digital converter as recited in claim 14, further comprising a clock oscillating unit for controlling on/off operations of the comparing unit and the counting unit by oscillating a clock signal input as a clock input of the comparing unit and the counting unit in response to the converting control signal.

18. The analog-to-digital converter as recited in claim 14, wherein the comparing unit includes:
- a comparator for comparing a level of the analog input voltage with a level of the tracking voltage and determining logic levels of an increment signal and a decrement signal according to the comparison result; and
- a low pass filter for low-pass-filtering the increment signal and the decrement signal.

19. The analog-to-digital converter as recited in claim 18, wherein the counting unit includes:
- a plurality of bit counters for separately storing the temperature code bit by bit and changing the stored digital code value in response to the increment signal and the decrement signal; and
- a counter controller for controlling the operations of the plurality of bit counters.

20. The analog-to-digital converter as recited in claim 19, wherein the counter controller controls the bit counters to operate in one of the first tracking scheme and the second tracking scheme by determining a logic level of an operation select signal in response to the increment signal and the decrement signal.

21. The analog-to-digital converter as recited in claim 19, wherein the counter controller resets the temperature code stored in the plurality of bit counters to a set value in response to the converting control signal.

22. The analog-to-digital converter as recited in claim 14, wherein the internal digital-to-analog converting unit determines the level of the tracking voltage in response to a test code during a test mode operation and the digital code during a normal mode operation.

23. The analog-to-digital converter as recited in claim 14, wherein the internal digital-to-analog converting unit includes:
- a multiplexer for selecting one of the digital code and the test code in response to a test mode operation signal; and
- a digital-to-analog converter for generating the tracking voltage in response to the digital code or the test code output from the multiplexer.

24. The analog-to-digital converter as recited in claim 23, further comprising a decoder for decoding the digital code or the test code output from the multiplexer so as to prevent an occurrence of glitch.

25. An analog-to-digital converting method for converting an analog input voltage into a digital code value corresponding to a level of the analog input voltage, comprising:
- comparing an analog input voltage with a tracking voltage;
- counting a digital code value corresponding to the comparison result in response to a counting control signal, the digital code value being counted with a relatively large unit variation width during an initial tracking period, the digital code value being counted with a relatively small unit variation width after the initial tracking period; and
- generating the tracking voltage corresponding to the digital code value.

26. The analog-to-digital converting method as recited in claim 25, wherein the counting of the digital code value includes:
- changing the digital code value in order from the most significant bit (MSB) to the least significant bit (LSB) during the initial tracking period; and
- changing the digital code value in order from the LSB to the MSB after the initial tracking period.

* * * * *